United States Patent

Laskowski

[15] 3,694,696

[45] Sept. 26, 1972

[54] DIODE CIRCUIT FOR SEQUENTIALLY FLASHING PHOTOFLASH LAMPS

[72] Inventor: Edward L. Laskowski, Parma, Ohio

[73] Assignee: General Electric Company

[22] Filed: April 17, 1970

[21] Appl. No.: 29,547

[52] U.S. Cl. ..............................315/241 P, 431/95 A

[51] Int. Cl. ..............................H05b 37/00

[58] Field of Search ................431/95, 95 A; 95/11.5; 240/1.3; 315/228, 232, 241 P, 312, 313, 317, 323

[56] References Cited

UNITED STATES PATENTS

| | | | |
|---|---|---|---|
| 3,532,931 | 10/1970 | Cote et al. | 315/240 |
| 3,500,732 | 3/1970 | Nijland et al. | 95/11.5 |
| 3,518,487 | 6/1970 | Tanaka et al. | 315/232 |

OTHER PUBLICATIONS

Sauber, James W. " Square-Law Detector," Electronics pp. 169- 172, Nov. 1955

*Primary Examiner*—Roy Lake
*Assistant Examiner*—Lawrence J. Dahl
*Attorney*—Norman C. Fulmer, Henry P. Truesdell, Frank L. Neuhauser, Oscar B. Waddell and Joseph B. Forman

[57] ABSTRACT

A diode circuit for causing sequential flashing of photoflash lamps from pulses of electrical energy. The diodes are successively connected in series between the individual photoflash lamps. Circuits comprising resistance in combination with diodes also are disclosed. The circuits are inexpensive and may be built into a disposable unitary array of photoflash lamps.

18 Claims, 8 Drawing Figures

Inventor:
Edward L. Laskowsk
by Norman C. Fulmer
His Attorney

Inventor:
Edward L. Laskowski
by Norman C. Fulmer
His Attorney

DIODE CIRCUIT FOR SEQUENTIALLY FLASHING PHOTOFLASH LAMPS

BACKGROUND OF THE INVENTION

The invention is in the field of electronic circuitry for sequentially flashing photoflash lamps, and is particularly useful with a unitary array of flash lamps, such as three or four or more lamps arranged to radiate their light in the same direction when they are sequentially flashed, so that the array need not be moved nor removed until all of its lamps have been flashed.

Numerous circuits have been devised for successively flashing photoflash lamps by pulses of electrical energy such as are obtained from a battery through a momentarily closed switch or from a capacitor which has been charged through a resistor from a battery, or from some other suitable energy source. Such a pulse of electrical energy usually is initiated by closure of a switch associated with the shutter mechanism of a camera. A type of circuit heretofore proposed employs mechanically actuated switches for applying the electrical pulses to successively different flashbulbs; another type of circuit utilizes heat-responsive or light-responsive means associated with the flash lamps and adapted to actuate switching means for connecting the pulse source to successively different flash lamps as each lamp becomes flashed; and a further type of circuit utilizes transistors or thyristors for automatically connecting the pulse source to successively different flash lamps as each lamp becomes flashed.

Another previously proposed circuit employs resistors successively connected in series with a plurality of individual flash lamps, so that the lamps are connected in electrical parallel through the resistors. The firing pulse source is connected to an end of the circuit, whereby each flash lamp is connected across the pulse source through successively greater resistance. The first pulse flashes the nearest lamp, which becomes an open circuit upon flashing, whereupon the next pulse flashes the next lamp, etc. In order to insure flashing of only one flash lamp (the nearest unflashed lamp to the pulse source) per firing pulse, it is desirable that the series resistors have relatively large values of resistance as compared to the resistances of the flash lamp filaments. On the other hand, low values of series resistances are desired, because large values of series resistance consume relatively large amounts of energy from the firing pulse so that it is desirable to provide a greater amount of firing pulse energy to insure that all of the lamps can be flashed. It has been found that this dilemma of desiring larger resistance values for one reason, and smaller resistance values for another reason, is not easy to resolve satisfactorily for insuring that only one flash lamp will flash per firing pulse and also that the energy per pulse will be capable of successively flashing all of the lamps of the array, with an economically feasible value of firing pulse voltage. These difficulties tend to offset an important advantage of the resistance network circuit: its low cost, so that the resistor circuit can be included in a throw-away multiple lamp unit, whereby only two electrical connections need be provided between the multiple lamp unit and the camera or flash adaptor with which it is used.

The reliability of the above-described resistance sequential flashing circuit can be improved if the flash lamps of the array have differing filament resistances, the lamp nearest the firing pulse source having the lowest filament resistance and the remaining lamps having successively higher values of filament resistance. However, this expedient suffers the disadvantage of higher costs of manufacturing the different-resistance lamps and of keeping track of which lamps have which filament resistance during storage and during assembly into the flash array. Another disadvantage of an array in which the lamps have differing filament resistances, is a reduction of flashing reliability because some of the lamps will not have optimum filament resistance for being flashed from the firing pulse.

SUMMARY OF THE INVENTION

Objects of the invention are to provide an improved circuit for sequentially flashing flashbulbs; to provide such a circuit which is free from the above-described disadvantages of resistance circuits; and to provide such a circuit that is low in cost and highly reliable in operation.

The invention comprises, briefly and in preferred embodiment, a plurality of photoflash lamps adapted to be sequentially flashed by a sequential series of firing voltage pulses, and one or more diodes successively connected in series between the lamps, so that the lamps are connected in electrical parallel through the diodes. The firing voltage pulse source is connected across an end of the lamp-diode circuit. The diodes are connected so as to be forward-biased by the firing voltage pulses. The invention further comprises, in combination with the foregoing, a resistance connected in the circuit in series between the firing voltage pulse source and the lamp-diode circuitry; a further embodiment of the invention comprises an additional photoflash lamp connected in parallel with the first lamp of the aforementioned array, through the series resistance.

DESCRIPTION OF THE PREFERRED EMBODIMENT

Figure 1:
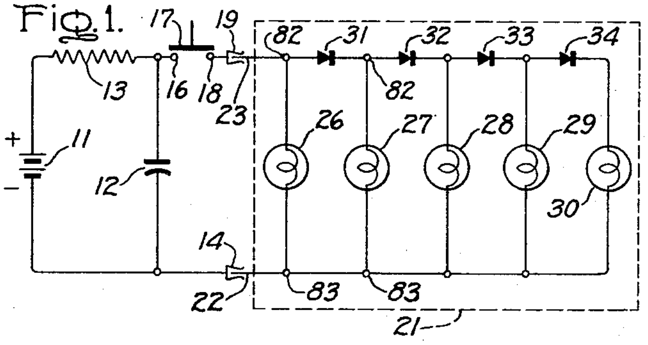
FIG. 1 is an electrical schematic drawing of a preferred embodiment of the invention.

In the circuit of FIG. 1, a battery 11 is connnected to charge a capacitor 12 through a resistor 13. In a preferred arrangement, the battery 11 has a voltage of 6 volts, the capacitor 12 has a capacitance of 500 microfarads, and the resistor 13 has a resistance of 1,000 ohms. One terminal of the capacitor 12 is connected to a connector plug terminal 14, and the other terminal of capacitor 12 is connected to a terminal 16 of a switch 17, the other terminal 18 thereof being connected to a second connector plug terminal 19. The switch 17 is adapted to be momentarily closed in synchronization with the opening of a camera shutter, in well-known manner. The circuitry thus far described functions as a source of electrical energy pulses for flashing photoflash lamps, and may be incorporated in a camera, or in a flash attachment for use with a camera. Although the firing pulse is sometimes called a "voltage" pulse, it is primarily the energy of the pulse, comprising the combination of voltage, current, and time duration, that causes a lamp to flash.

Figure 2:
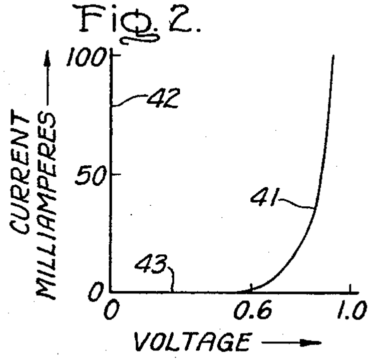
FIG. 2 shows a current-voltage characteristic curve of a typical diode.

A flash lamp array unit 21 is provided with a pair of connector prongs 22 and 23 adapted for electrical engagement with the terminals 14 and 19, respectively. The unit 21 contains a plurality of photoflash lamps 26 through 30 which may be of conventional type, such as General Electric type AG—1, each containing a filament provided with electrical connection lead wires and adapted for initiating a flash of combustible material contained within the bulb. One end of the filaments of each of the lamps 26—30 is connected to the connector prong 22. The other end of the filament of the first lamp 26 is connected to the connector prong 23, and the other ends of the remaining filaments of lamps 27—30 are successively connected, through diodes 31 through 34, to the connector prong 23. The diodes 31—34 may each be, for example, General Electric silicon diodes type 1N5060, each having a current-voltage characteristic curve as shown in FIG. 2, or they may all be formed on a single monolithic integrated circuit semiconductor chip. Thus, in effect, the lamps 26—30 are connected in a parallel combination through the diodes 31–34, this parallel combination being adapted for connection across the source of energy pulses at the terminals 14 and 19, each successive lamp being connected to the pulse source through a successively greater number of diodes.

Preferably the lamps 26–30 of the array 21 are provided with individual reflectors, and arranged to radiate the light emitted therefrom in the same direction. If desired, another combination of lamps and diodes may be provided in the unit 21, for radiating the light emission in the opposite direction, so that when all of the lamps at the front of the unit have been flashed, the unit may be turned around so that the rear array of lamps will then face frontwardly, for obtaining an additional number of flashes from a single unit. Other connector prongs similar to 22 and 23 could be provided for connecting the rear array of lamp circuitry to the connectors 14 and 19 when the unit is turned around so that the "rear" array of flash lamps faces frontwardly.

In FIG. 2, the current-voltage characteristic curve 41 of each of the diodes 31—34 is plotted with respect to a vertical axis 42 representing current, and a horizontal axis 43 representing voltage. The "threshold" point of each of the diodes is 0.6 volts. As indicated by the curve of FIG. 2, each of the diodes has a very low resistance when the voltage thereacross is greater than 1 volt, and a very high resistance when the voltage thereacross is less than 0.6 volts. A plurality of diodes may be "stacked" in series to increase these voltage characteristics. The term "diode" used herein includes such a stacked plurality of diode units.

The circuit of FIG. 1 functions as follows. Upon a momentary closing of the switch 17, in synchronization with the opening of a camera shutter, the electrical energy stored in the capacitor 12 discharges into the circuit of the lamp unit 21, in the form of an electrical pulse having an approximately exponential decay characteristic. Most of the capacitor's electrical energy discharges through the filament of the first lamp 26, and, although a small portion of the energy flows through the filament of lamp 27 via the diode 31, the voltage drop across the diode 31 limits the amount of electrical energy discharged through the filament of lamp 27 to a value below that which will cause lamp 27 to flash. The remaining diodes in the circuit further limit the amount of energy discharged into the remaining flash lamps. As the electrical energy of the pulse from capacitor 12 discharges through the filament of lamp 26, the filament resistance (which initially is about 0.6 ohms) increases as the filament becomes incandescent, and the filament burns out and becomes an open circuit as the lamp flashes. The moment at which the lamp 26 flashes and its filament becomes an open circuit, is a critical moment at which the next lamp 27 is most likely to undesirably flash, because when the filament of lamp 26 becomes an open circuit the remaining energy in capacitor 12, minus the voltage drop provided by the diode 31, is available for the remaining lamps. However, at this moment the voltage on capacitor 12 has reduced to a value such that the forward resistance of diode 31 is increasing, and this increasing diode resistance, in combination with the internal resistance of lamp 27, providing a voltage divider action to cause the diode to take a greater share of the voltage on capacitor 12, limits the energy to the next lamp 27 to a value such that the lamp will not flash.

Upon the next momentary closing of the switch 17, in synchronization with the opening of the camera shutter, most of the electrical discharge pulse energy from the capacitor 12 flows through the second flash lamp 27, since the first lamp 26 now is an open circuit. The energy discharge through lamp 27 is reduced slightly by the approximately 0.6 volt voltage drop across the diode 31, but is ample for causing the lamp 27 to flash. As was the case when lamp 26 was being flashed, the next successive diode 32 reduces the voltage, and hence energy, flowing to the remaining lamps so that they will not flash, and as the second lamp 27 flashes and its filament becomes an open circuit, the resistance of diode 32 begins to increase so that, in junction with its voltage drop, it prevents any of the other lamps from undesirably flashing. The foregoing procedure is repeated until all of the lamps of the array have been flashed.

If desired, the flash array unit 21 may be removed from the camera or flash adaptor after some of its lamps have been flashed, and reinserted at a later time for flashing the remaining lamps. After the lamps have been flashed, the array unit 21 may be discarded. The success and reliability of the diode circuit just described, is largely due to the fact that a relatively large amount of the pulse energy discharge is applied to the nearest unflashed lamp, and relatively little energy is applied to the remaining lamps of the circuit. This is achieved by a combination of the diode voltage drops, diode changes in resistance, and the flash lamp resistances.

Figure 3:
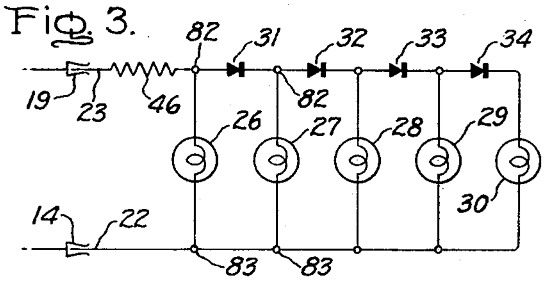
FIGS. 3 and 4 show modifications of the circuit of FIG. 1 in accordance with the invention.

The flash array circuit of FIG. 3 is the same as that of FIG. 1, except that a resistor 46 is connected in the circuit in series between the firing voltage pulse source and the lamp-diode circuitry. The resistor 46 is shown connected between the connector prong 23 and a filament lead of the first flash lamp 26; however, the resistor 46 could be connected between the connector prong 22 and the other filament terminal of the first lamp 26. Also, any or all of the diodes 31–34 could be connected in the lower connecting line that is connected to the prong 22, in which case these diodes should be turned around so as to be forward-biased by the firing voltage pulses. It is preferred, however, that the resistor 46 and diodes 31—34 be connected in series with one another, as shown, so that they may be manufactured in a unitary low cost integrated circuit form.

The use of series resistor 46 greatly improves the firing reliability of the circuit, as will now be described with reference to FIGS. 5 through 8.

Figure 5:
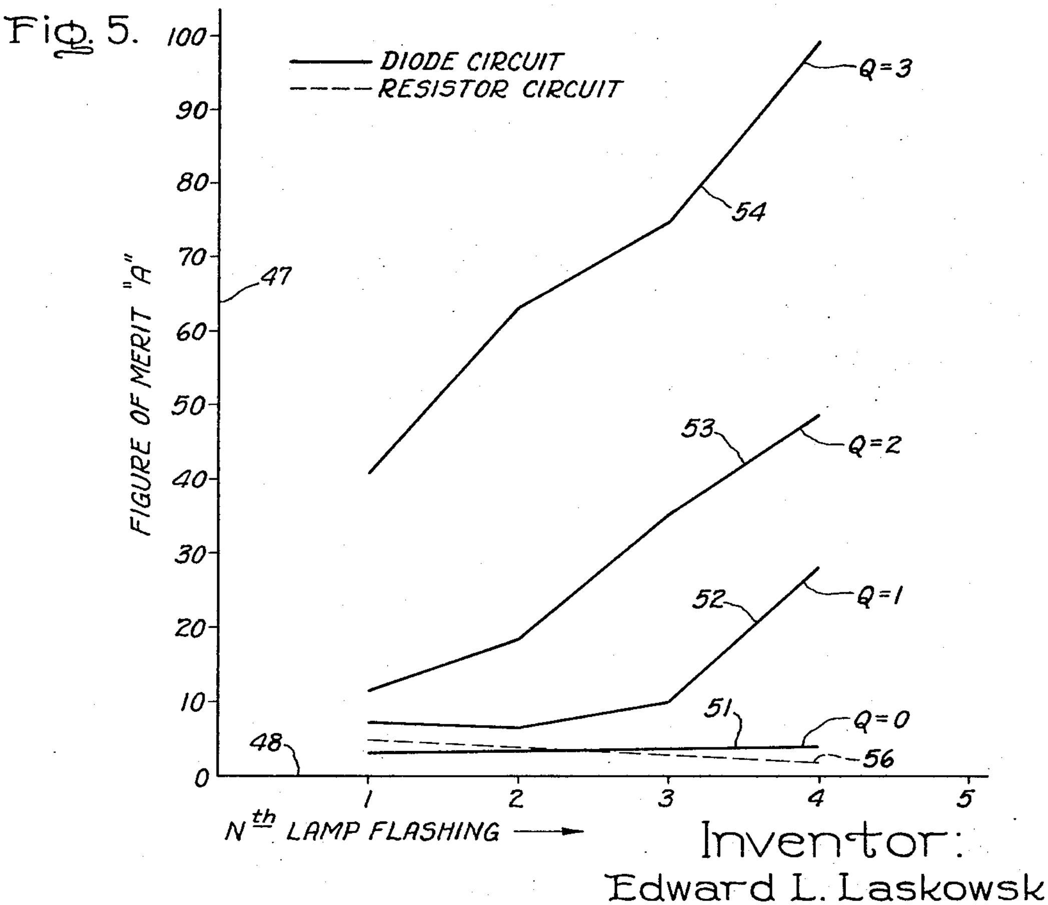
FIGS. 5 and 6 are charts showing "Figures of Merit" of the diode circuit of the invention as compared with resistor circuits of the prior art.

FIG. 5 is a plot of Figure of Merit "A", for the individual flashing of each of the five flash lamps of FIG. 3. The Figure of Merit "A" is calculated as follows:

$$\text{"A"} = \frac{\text{Firing pulse energy into lamp to be flashed}}{\text{Firing pulse energy into next adjacent lamp}}$$

From this definition of "A", it will be seen that it represents the reliability of firing only one flash bulb, and no others, for each occurrence of the firing voltage pulse. FIG. 5 shows four curves of the Figure of Merit "A" for the diode circuit of FIG. 3, for differing values of "Q" ranging from zero to 3. "Q" is computed as follows:

$$\text{"Q"} = \frac{\text{Resistance of series resistor 46}}{\text{Resistance of flash lamp filament}}$$

Thus, "Q" is the ratio of resistance of the resistor 46 to the resistance of a flash lamp filament. For example, if the flash bulb filament has a resistance of 0.6 ohms, and the resistor 46 has a resistance of 1.2 ohms, then "Q" is equal to 2. In FIG. 5, the vertical axis 47 is a scale of the Figure of Merit "A", and the horizontal axis 48 represents the individual flashings of the five lamps of the array of FIG. 3. The solid-line curves 51 through 54 are plots of Figure of Merit "A" for diode circuitry having "Q" values of 0 through 3, respectively. The dashed-line curve 56 similarly represents the Figure of Merit "A" for an all-resistor circuit in accordance with the prior art, i.e., a circuit in which each of the diodes 31 through 34 is respectively replaced by a resistor. The curve 56 for a resistor circuit is substantially unaffected by the presence or absence of the additional series resistor 46; i.e., the value of "Q" is inconsequential in an all-resistor circuit.

As is apparent from the curves of FIG. 5, the diode circuit of the invention, with a "Q" of 0, has a Figure of Merit "A" substantially the same as that of the prior art resistor circuitry. However, with values of resistor 46 such that the "Q" is 1, 2, or 3, the reliability of the diode circuit of the invention is substantially increased. For example, with a "Q" of 2 as plotted by the curve 53, when the first lamp 26 is being flashed, it receives over ten times as much energy from the firing pulse as does the second lamp 27. When the second lamp 27 is being flashed, it receives 18 times as much pulse energy as does the third lamp 28; when the third lamp 28 is being fired, it receives 36 times as much firing pulse energy as does the fourth lamp 29; and when the fourth lamp 29 is being flashed, it receives nearly 50 times as much energy from the firing pulse as does the fifth lamp 30. Thus, with a "Q" of 2 in the diode circuit of the invention, the reliability of flashing one bulb only per firing pulse is much greater than that of the prior art resistance circuit, which, as shown by curve 56, has a Figure of Merit "A" of less than 5 no matter what value of "Q" is provided in the circuit.

Figure 6:
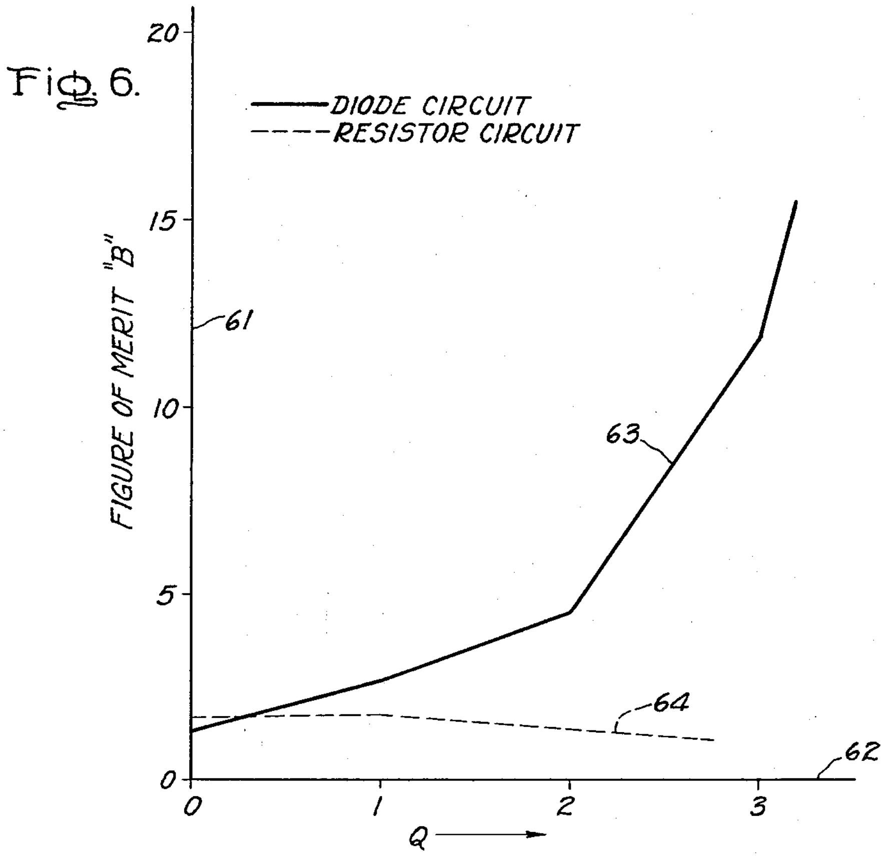

In FIG. 6, the vertical axis 61 is a scale of Figure of Merit "B", and the horizontal axis 62 is a scale of values of "Q" from 0 to 3. The Figure of Merit "B" as represented by the vertical axis 61, is calculated as follows:

$$\text{"B"} = \frac{\text{Lowest firing pulse energy into a lamp to be flashed}}{\text{Highest firing pulse energy into a lamp not to be flashed}}$$

Thus, the Figure of Merit "B" is an indication of the efficiency and reliability of the circuit causing each lamp to fire successfully, in turn, from the firing voltage pulse, without more than one lamp flashing per pulse. The solid-line curve 63 of FIG. 6 is a plot of Figure of Merit "B" for the diode circuit of FIG. 3, and the dashed-line curve 64 is a plot of Figure of Merit "B" for a prior art resistor type of circuit. As is apparent from the Figure, for a "Q" value of 0, the diode circuit and resistor circuit are comparable, and the resistor circuit as indicated by dashed-line 64 remains about the same, at a value of about 2, irrespective of the value of "Q". The Figure of Merit "B" for the diode circuit of the invention, however, as indicated by the curve 63, increases considerably as the value of "Q" is increased above unity, and for a "Q" of 2 the diode circuit has a Figure of Merit "B" of nearly 5.

Figure 7:
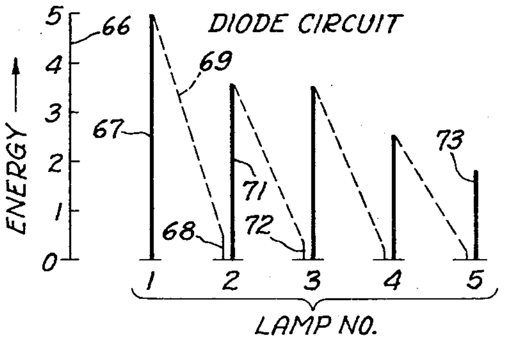
FIGS. 7 and 8 are bar graphs illustrating the energy distribution of firing voltage pulses among the flashbulbs of a five-bulb array, for a diode circuit and for a resistor circuit, respectively.
Figure 8:
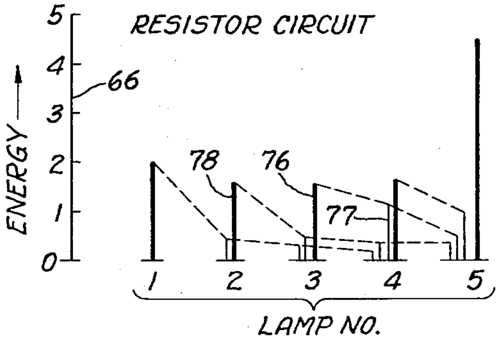

In the bar charts of FIGS. 7 and 8, the vertical axis 66 represents the energy per firing pulse per lamp, as provided by discharge of the capacitor 12, and the horizontally arranged numerals 1 through 5 represent, respectively, the five lamps of the array of FIG. 3 (resistor 46 having a value so that "Q" = 2), numeral 1 representing the lamp 26 nearest the firing energy pulse source. The thick vertical bars represent the amount of firing pulse energy applied to a lamp being flashed, and the next following thin lines represent the amount of the firing voltage pulse energy which undesirably is applied to the next succeeding lamps. In FIG. 7, the thick bar 67 at lamp No. 1 represents the firing pulse energy applied to the first lamp 26, and the thin vertical bar 68 represents the amount of firing pulse energy which is simultaneously applied to the next or second lamp 27. The tops of these energy bars are connected by a dashed line to indicate their associative relationship. No significant energy flows to the next three lamps, hence none is indicated in FIG. 7. Similarly, the thick vertical bar 71 at lamp No. 2 indicates the amount of firing pulse energy that is applied to the second lamp 27 when it is to be flashed, the thin vertical bar 72 at lamp position 3 indicating the amount of this pulse energy that is undesirably fed to the third lamp 27, etc. Inspection of FIG. 7 will show that the diode circuit of FIG. 3, in accordance with the invention, achieves a high ratio of firing pulse energy that is applied to the lamp to be flashed (represented by the thick vertical bars) with respect to the amount of firing pulse energy undesirably applied to the next succeeding lamp (indicated by the thin vertical bars). This is another way of illustrating the desirable high value of Figure of Merit "A" of the diode circuit of FIG. 3 (resistor 46 having a value such that "Q" is 2). Also, inspection of FIG. 7 shows the desirably high value of Figure of Merit "B" for the circuit of FIG. 3, since the lowest value of firing pulse energy into a lamp to be flashed, i.e., that represented by the thick vertical bar 73 for lamp 5, is quite high with respect to the highest value of firing pulse energy fed into a lamp not to be flashed, i.e., the energy represented by the thin line 68 for lamp 2 when lamp 1 is being flashed.

FIG. 8 illustrates the firing pulse energies applied to the different flash bulbs for a resistor circuit of the prior art, in a manner similar to that of FIG. 7; i.e., the thick vertical bars represent the firing pulse energies desirably fed into lamps to be flashed, and the thin vertical bars representing the amount of firing pulse energy undesirably applied to next succeeding lamps when a lamp is being flashed, the thick vertical bar representing energy of a lamp being flashed being connected by dashed lines to the thin-vertical line energy representations for the succeeding lamps. Inspection of FIG. 8 readily shows that the ratio of firing pulse energy to a lamp to be flashed, to that applied to next succeeding lamps, is rather low; i.e., the resistor circuit has a relatively low value of Figure of Merit "A", especially when lamp No. 3 is being fired, because the value of firing pulse energy 76 applied to lamp 3 when it is flashed, is not much greater than the amount of pulse energy 77 which is simultaneously and undesirably applied to the next lamp No. 4. Also, it will be seen that the Figure of Merit "B" for the resistor circuit is relatively low, since the lowest amount of energy 78 applied to a lamp to be flashed, is only slightly higher than the greatest amount of pulse energy 77 that is applied to a lamp that is not to be fired.

For the comparative resistor circuit from which data is taken for FIG. 8, and for the dashed-line curves 56 and 64 of FIGS. 5 and 6, respectively, if the photoflash lamps have the filament resistance value of 0.6 ohms, the successive series resistors that are substituted for the diodes 31 through 34 of FIG. 3 would each have a resistance of 0.2 ohms, this resistance value being a compromise between the desire to have higher values of resistance for increasing the Figure of Merit "A", and lower values of resistance for increasing the Figure of Merit "B", for the resistor circuit. The curves of FIGS. 5 and 6, and the vertical bars of the bar charts of FIGS. 7 and 8, agree with data obtained by theoretical calculation, by analogue simulation of the circuitry, and by actual experimental circuitry. The data obtained by each of these three methods correlated quite closely together. It should be realized, however, that the curves and bars shown in the figures are representative of approximately average values, and in any specific circuitry these values are subject to variation of 10 to 20 percent or more, due to inherent differences in the firing characteristics of individual flash bulbs and of different characteristics among different individual diodes and resistors.

Figure 4:
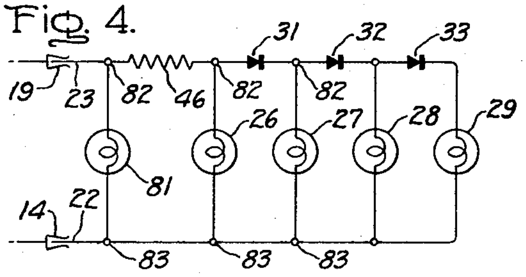

FIG. 4 shows a modification of the circuit of FIG. 3, in which a photoflash lamp 81 is added to the circuit, across the connector prongs 23 and 22, ahead of the resistor 46, and the last diode 34 and flash lamp 30 of FIG. 3 are omitted. Thus, the circuit of FIG. 4 will successively flash five lamps, with one less diode in the circuitry than in that of FIG. 3. However, for the circuit of FIG. 4 to function reliably with regard to Figure of Merit "A" as between the first lamp 81 and second lamp 26 (i.e., to insure that the second lamp 26 will not undesirably flash when the first lamp 81 is being flashed), the first lamp 81 should have a lower value of filament resistance than the remaining lamps of the circuit. It has been found that the circuit of FIG. 4 functions very reliably if the first lamp 81 has a value of filament resistance that is approximately one-half that of the remaining lamps; i.e., the first lamp 81 should have a filament resistance of 0.3 ohms if the remaining lamps 26–29 each have a filament resistance of 0.6 ohms. Therefore, the circuit of FIG. 4 has the advantage of eliminating one of the diodes, but suffers a bit from the fact that the first lamp 81 must have a different filament characteristic than the rest of the flash lamps in the circuit for achieving reliable operation.

The diode circuitry, or diode and resistance circuitry, of the invention can be incorporated into a camera or flash adaptor instead of in a disposable flash array, with the requisite number of electrical connectors being provided for connecting the filament lead wires of the lamps 26, etc., of the array respectively across the different pairs of firing pulse terminal points 82, 83 of the circuitry.

While a preferred embodiment of the invention, and modifications thereof, have been shown and described, other embodiments and modifications thereof will become apparent to persons skilled in the art, and will fall within the scope of invention as defined in the following claims.

What I claim as new and desire to secure by Letters Patent of the United States is:

1. A circuit for causing a plurality of photoflash lamps to be flashed sequentially by sequential firing energy pulses of given electrical polarity and amplitudes, said circuit comprising a plurality of pairs of connection terminal points adapted for electrical connection thereto of respective individual lamps of said plurality of flash lamps, wherein the improvement comprises connection means including one or more diodes successively connected in series between said pairs of terminal points to connect said pairs of terminal points into an electrical parallel circuit through said diodes, a first pair of said terminal points at one end of said parallel circuit being adapted for connection to a source of said firing pulses, said diodes being connected in the circuit so as to be forward-biased by said given polarity of the firing pulses.

2. A circuit as claimed in claim 1, including resistance means connected to at least one of the terminal points of said first pair and adapted to be connected in series between said end of the parallel circuit and said source of firing pulses.

3. A circuit as claimed in claim 2, including an additional pair of connection terminal points adapted for electrical connection thereto of a flash lamp, and means connecting said additional pair of connection terminal points in parallel with said first pair of terminal points through said resistance means.

4. A circuit for causing a plurality of photoflash lamps to be flashed sequentially by sequential firing energy pulses of given electrical polarity and amplitudes, said circuit comprising first and second pairs of connection terminal points adapted for electrical connection thereto of respective individual lamps of said plurality of flash lamps, wherein the improvement comprises a diode connected between a terminal point of said first pair and a terminal point of said second pair of terminal points, and means electrically connecting together the remaining terminal points of said first and second pairs of terminal points, said first pair of terminal points being adapted for connection to a source of said firing pulses, said diode being connected in the circuit to be forward-biased by said given polarity of the firing pulses.

5. A circuit as claimed in claim 4, including resistance means connected to at least one of the terminal points of said first pair and adapted to be connected in series between said first pair of terminal points and said source of firing pulses.

6. A circuit as claimed in claim 5, including a third pair of connection terminal points adapted for electrical connection thereto of a flash lamp, and means connecting said third pair of terminal points in parallel with said first pair of terminal points through said resistance means.

7. A disposable unitary array of photoflash lamps including circuitry for causing said lamps to be flashed sequentially by sequential firing energy pulses of given electrical polarity and amplitudes, each of said lamps containing a filament for initiating flashing of the lamp and adapted to become an open circuit when said flashing occurs, wherein the improvement comprises connection means including one or more diodes successively connected in series between the filaments of said lamps to connect said filaments into an electrical parallel circuit through said diodes, and electrical means adapted for connecting the first lamp filament at one end of said parallel circuit to a source of said firing pulses, said diodes being connected in the circuit so as to be forward-biased by said given polarity of the firing pulses.

8. An array as claimed in claim 7, in which said electrical means includes resistance means connected to said first lamp filament and adapted to be connected in series between said first lamp filament and said source of firing pulses.

9. An array as claimed in claim 8, in which said lamp filaments have a given value of electrical resistance, and in which said resistance means has a value of resistance equal to or greater than said given value of resistance of the lamp filaments.

10. An array as claimed in claim 8, including an additional photoflash lamp having a filament adapted to become an open circuit when said additional lamp is flashed, and means connecting said filament of the additional lamp in parallel with said first lamp filament through said resistance means.

11. An array as claimed in claim 10, in which the filament of said additional photoflash lamp has a value of resistance less than that of said first lamp.

12. An array as claimed in claim 11, in which said filament resistance of the additional lamp is approximately half that of said first lamp.

13. A disposable unitary array of photoflash lamps including circuitry for causing said lamps to be flashed sequentially by sequential firing energy pulses of given electrical polarity and amplitudes, each of said lamps containing a filament for initiating flashing of the lamp and adapted to become an open circuit when said flashing occurs, wherein the improvement comprises a diode connected between ends of the filaments of first and second ones of said lamps, means electrically connecting together the remaining ends of said filaments of the first and second lamps, and electrical means adapted for connecting the filament of said first lamp to a source of said firing pulses, said diode being connected to be forward-biased by said given polarity of the firing pulses.

14. An array as claimed in claim 13, in which said electrical means includes resistance means connected to said first lamp filament and adapted to be connected in series between said first lamp filament and said source of firing pulses.

15. An array as claimed in claim 14, in which said lamp filaments have a given value of electrical resistance, and in which said resistance means has a value of resistance equal to or greater than said given value of resistance of the lamp filaments.

16. An array as claimed in claim 15, including an additional photoflash lamp having a filament adapted to become an open circuit when said additional lamp is flashed, and means connecting said filament of the additional lamp in parallel with said first lamp filament through said resistance means.

17. An array as claimed in claim 16, in which the filament of said additional photoflash lamp has a value of resistance less than that of said first lamp.

18. An array as claimed in claim 17, in which said filament resistance of the additional lamp is approximately half that of said first lamp.

* * * * *